US012761545B2

(12) United States Patent
Wang

(10) Patent No.: US 12,761,545 B2
(45) Date of Patent: Oct. 13, 2026

(54) SYSTEM FOR OPTIMIZING OPC LITHOGRAPHY MODEL PARAMETERS

(71) Applicant: Shanghai Huali Integrated Circuit Corporation, Shanghai (CN)

(72) Inventor: Zhenbin Wang, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 698 days.

(21) Appl. No.: 18/342,319

(22) Filed: Jun. 27, 2023

(65) Prior Publication Data

US 2024/0184196 A1 Jun. 6, 2024

(30) Foreign Application Priority Data

Dec. 5, 2022 (CN) ......................... 202211546761.8

(51) Int. Cl.
*G03F 1/36* (2012.01)
*G06F 30/398* (2020.01)

(52) U.S. Cl.
CPC .............. *G03F 1/36* (2013.01); *G06F 30/398* (2020.01)

(58) Field of Classification Search
CPC ................................. G03F 1/36; G06F 30/398
USPC ............................................................ 716/53
See application file for complete search history.

(56) References Cited

U.S. PATENT DOCUMENTS 7,178,127 B2 * 2/2007 Abrams .................... G03F 1/36 716/51
7,653,513 B2 * 1/2010 Resende ................. G06F 7/544 702/181
7,747,978 B2 * 6/2010 Ye ........................... G03F 7/705 430/30
8,103,979 B2 * 1/2012 Zou .......................... G03F 1/36 716/50
8,279,409 B1 * 10/2012 Sezginer ................... G03F 1/70 716/55
8,458,626 B1 * 6/2013 Tirapu-Azpiroz ........ G03F 1/36 716/54
9,857,693 B1 * 1/2018 Liu ......................... G03F 7/705
11,762,283 B2 * 9/2023 Poonawala ............... G03F 1/36 716/51

(Continued)

FOREIGN PATENT DOCUMENTS

EP 4538938 A1 * 4/2025 ............. G06N 20/00
WO WO-2025040341 A1 * 2/2025 ............. G06N 20/00

*Primary Examiner* — Suresh Memula

(74) *Attorney, Agent, or Firm* — Quarles & Brady LLP

(57) ABSTRACT

The present application discloses a method for optimizing OPC lithography model parameters. Preliminary suboptimal parameter combinations in proximity to a plurality of local minima of a lens beam focus BF and defocus start DS are quickly found by means of a random direction search method; and then an optimal parameter combination of the lens beam focus BF and defocus start DS is finally obtained on the basis of the suboptimal parameter combinations by means of a precise search method. An optimal parameter solution can be found quickly by combining the random direction search method and the precise search method, without artificially configuring an initial search point. Moreover, the algorithm has a high convergence rate and strong robustness, and can quickly and precisely obtain parameters such as the lens beam focus BF and defocus start DS in modeling of an OPC lithography model.

9 Claims, 1 Drawing Sheet

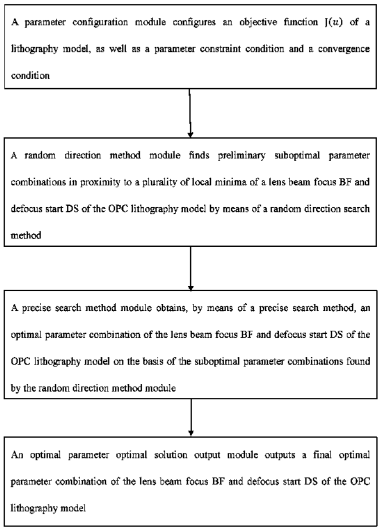

(56) References Cited

U.S. PATENT DOCUMENTS

| | | | | |
|---|---|---|---|---|
| 12,416,854 | B2 * | 9/2025 | Tao | G03F 1/36 |
| 2025/0155794 | A1 * | 5/2025 | Kang | G03F 1/76 |

* cited by examiner

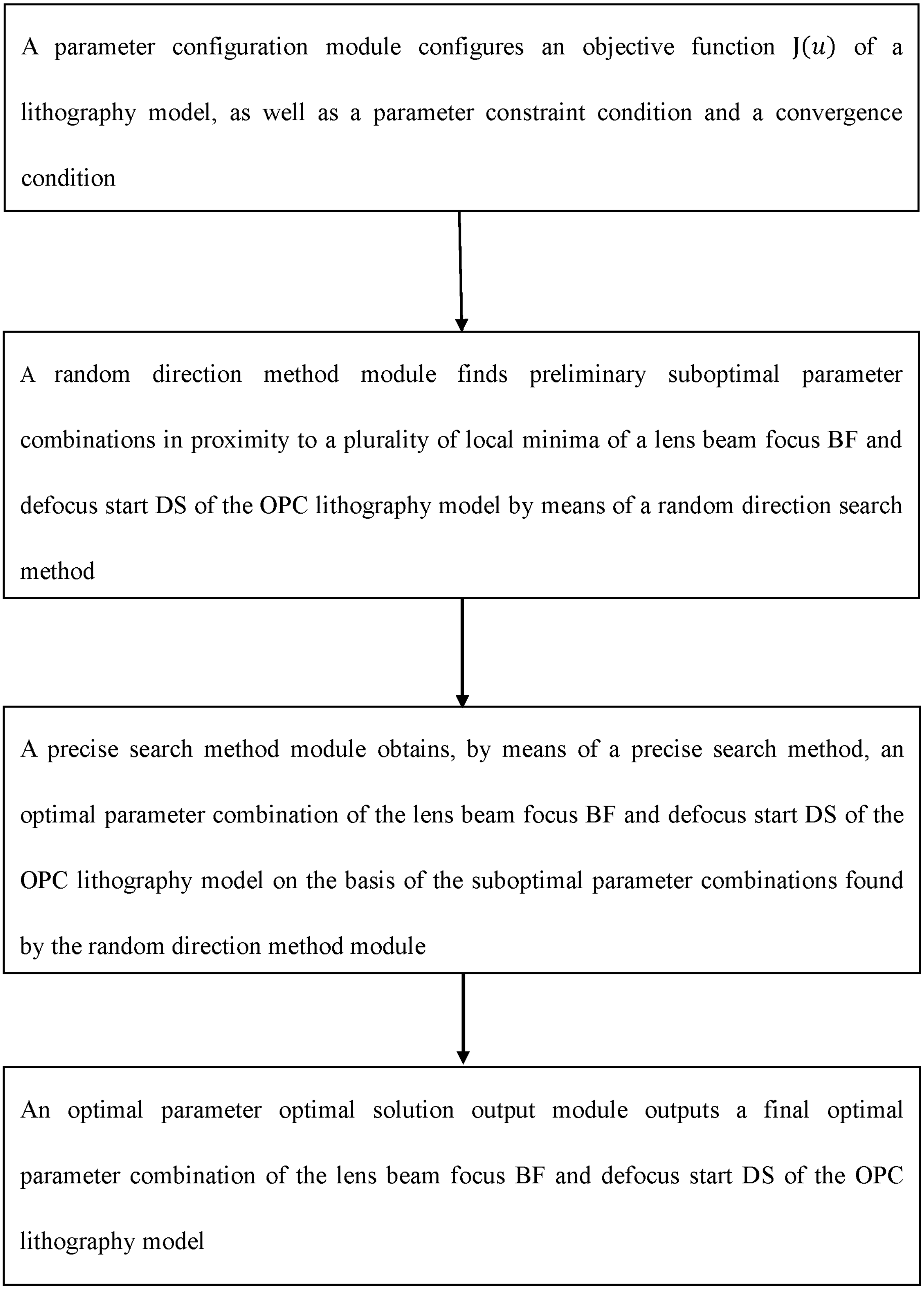
A parameter configuration module configures an objective function $J(u)$ of a lithography model, as well as a parameter constraint condition and a convergence condition
A random direction method module finds preliminary suboptimal parameter combinations in proximity to a plurality of local minima of a lens beam focus BF and defocus start DS of the OPC lithography model by means of a random direction search method
A precise search method module obtains, by means of a precise search method, an optimal parameter combination of the lens beam focus BF and defocus start DS of the OPC lithography model on the basis of the suboptimal parameter combinations found by the random direction method module
An optimal parameter optimal solution output module outputs a final optimal parameter combination of the lens beam focus BF and defocus start DS of the OPC lithography model

SYSTEM FOR OPTIMIZING OPC LITHOGRAPHY MODEL PARAMETERS

CROSS-REFERENCES TO RELATED APPLICATIONS

This application claims priority to Chinese patent application No. 202211546761.8, filed on Dec. 5, 2022 at CNIPA, and entitled "METHOD FOR OPTIMIZING OPC LITHOGRAPHY MODEL PARAMETERS", the disclosure of which is incorporated herein by reference in entirety.

TECHNICAL FIELD

The present application relates to the technical field of semiconductor lithography, in particular to a method for optimizing OPC lithography model (Litho Model) parameters.

BACKGROUND

With the continuous reduction of semiconductor process nodes, process nodes, in particular those equal to or less than 40 nm, gradually become mainstream products, and Optical Proximity Correction (OPC) becomes an indispensable and important link in a semiconductor manufacturing process. A precise OPC model is a prerequisite for OPC correction, and an OPC lithography model (Litho Model) is an indispensable foundation and important link for a final resist model of the OPC. The quality of the OPC lithography model (Litho Model) directly determines a success or failure of the final resist model. Currently, modeling of the OPC lithography model (Litho Model) mainly relies on personal experience of OPC engineers, that is, by artificially estimating the range of modeling parameters and then performing appropriate meshing on relevant OPC lithography model (Litho Model) parameters, an optimal solution of a lithography (Litho) parameter is obtained by means of a relevant optimization method. In this case, on the one hand, it is very difficult to control the meshing density of the lithography model (Litho Model) parameters. For example, if the meshing is excessively sparse, only a local optimal solution may be obtained, while no global optimal solution can be obtained; on the contrary, if the meshing is excessively dense, the entire optimization process requires excessive time, and due to significant repeated and ineffective optimization calculations, it is difficult to quickly find the optimal solution. On the other hand, parameter meshing is generally applicable to only the case of two-dimensional parameter optimization, and in the cases of three and more than three-dimensional parameter optimization, the number of meshes increases exponentially, making the meshing too large to be applicable.

BRIEF SUMMARY

The technical problem to be solved by the present application is to provide a method for optimizing OPC lithography model (Litho Model) parameters, which can quickly and precisely obtain parameters such as a lens beam focus (BF) and defocus start (DS) in modeling of an OPC lithography model (Litho Model).

To solve the above technical problem, the present application provides a method for optimizing OPC lithography model (Litho Model) parameters, provided with a parameter configuration module, a random direction method module, and a precise search method module;

the parameter configuration module is used to configure an objective function J(u) of a lithography model (Litho Model), as well as a parameter constraint condition and a convergence condition;

the random direction method module finds preliminary suboptimal parameter combinations in proximity to a plurality of local minima of a lens beam focus BF and defocus start DS of the OPC lithography model (Litho Model) by means of a random direction search method; and the precise search method module obtains, by means of a precise search method, an optimal parameter combination of the lens beam focus BF and defocus start DS of the OPC lithography model (Litho Model) on the basis of the suboptimal parameter combinations found by the random direction method module.

In an example, the objective function J(u) of the lithography model is:

$$J(u) = \frac{1}{2n}\sqrt{\frac{\sum_{i=1}^{n} Wt_i * [T(x_i, y_i, BF, DS) - CD(x_i, y_i)]^2}{\sum_{i=1}^{n} Wt_i}}, \; u = [BF, DS]^T;$$

$T(x_i, y_i, BF, DS)$ is a CD value estimated by means of an optical imaging model, $CD(x_i, y_i)$ is a gauge calibration CD value obtained after exposure performed by an actual lithography system, $Wt_i$ is a weight coefficient, the value of which is in positive correlation with the importance of the CD value, and n is the number of all feature patterns;

the parameter constraint condition of the objective function J(u) of the OPC lithography model includes:

$$G_j(u) \le 0, j \in I;$$

$$G_1(u)=a_1-\mathrm{BF}, G_2(u)=\mathrm{BF}-b_1; \text{ and}$$

$$G_3(u)=a_1-\mathrm{DS}, G_4(u)=\mathrm{DS}-b_2;$$

$a_1$ is a BF lower limit value, $b_1$ is a BF upper limit value, $a_2$ is a DS lower limit value, and $b_2$ is a DS upper limit value, i.e., $a_1 \le BF \le b_1$, and $a_2 \le DS \le b_2$; $a_1$, $b_1$, $a_2$, and $b_2$ are determined by a lithography machine lens projection system and the thickness of a photoresist; and the convergence condition of the objective function J(u) of the OPC lithography model includes a random direction error $\varepsilon_1$ and a precise search method error $\varepsilon_2$, satisfying $0 \le \varepsilon_2 < \varepsilon_1 < 1$.

In an example, the random direction method module finds a feasible direction of a steepest descent in an objective function value on the basis of randomly generated feasible points and feasible directions of the lens beam focus BF and defocus start DS that satisfy the constraint condition, performs a line search to obtain a search step and thus obtain a next feasible point, then repeats the previous operation until a feasible point satisfying an error condition is finally found, and outputs the feasible point as a precise search initial feasible point to the precise search method module; and the precise search method module converts the objective function of the lithography model (Litho Model) into a sequential quadratic programming (SQP) objective function on the basis of the precise search initial feasible point, and solves the sequential quadratic programming SQP objective function according to the parameter constraint condition and the convergence condition, so as to obtain optimal lens beam focus BF parameter and defocus start DS parameter of the OPC lithography model (Litho Model).

In an example, an operation process of the random direction method module includes the following steps:

(1) configuring random direction method calculation precision $\varepsilon_1$;

(2) randomly selecting a feasible point as a random initial point $u_0$;

(3) generating k n-dimensional random unit vectors $e^j$ (j=1, 2, . . . , k), k being a positive integer;

(4) taking an experimental step $a_0$, and calculating k random points $u_j$;

(5) finding a feasible random points $u_L$ from the k random points, and generating a feasible search direction d, $d=u_L-u_0$;

(6) from the random initial point $u_0$, performing iteration using the feasible search direction d and the experimental $a_0$ until a new point u that satisfies all search conditions and has no descent in the objective function value is found; and (7) if the convergence condition satisfies $|J(u_L)-J(u_0)|<\varepsilon_1$, ending the iteration, or otherwise, assigning the value of $u_L$ to $u_0$, i.e., $u_0 \leftarrow u_L$, and returning to step (2).

In an example, a process of generating the random initial point $u_0$ is:

first generating two pseudo random numbers $q_1$ and $q_2$ within an interval (0, 1), $$BF_0=a_1+q_1*(b_1-a_1), DS_0=a_2+q_2*(b_2-a_2), \text{ and } u_0=[BF_0, DS_0]^T.$$

In an example, a method of generating the k n-dimensional random unit vectors $e^j$ in step (3) is:

obtaining the random unit vector $e^j$ on the basis of a pseudo random number $r_i^j$ generated within an interval (−1,1), $$e^j = \frac{1}{\sqrt{\sum_{i=1}^{n}\left(r_i^j\right)^2}}\begin{bmatrix} r_1^j \\ r_2^j \\ \cdots \\ r_n^j \end{bmatrix}.$$

In an example, the precise search method module, on the basis of a current iteration feasible point $u_k$ using an SQP algorithm, obtains a feasible search direction $d_k$ and a corresponding Lagrange multiplier $\lambda_j$:

making $$\nabla J(u_k)^T d_k + \frac{1}{2} d_k^T H_k d_k + \sum_{j\in I} \lambda_j \nabla G_j(u_k)^T d_k$$

minimum, and $$G_j(u_k)+\nabla G_j(u_k)^T d_k \le 0, j\in I;$$

wherein $H_k$ is a second derivative matrix $$\nabla_{uu}^2 L(u_k, \lambda_k)$$

of a Lagrange function $$L(u, \lambda) = J(u) + \sum_{j\in I} \lambda_j G_j(u)$$

with respect to u, a next iteration point is $u_{k+1}=u_k+d_k$, and $\lambda_j$ is a Lagrange constant.

In an example, the SQP algorithm used by the precise search method module includes the following steps:

S0. providing an initial point $u_0$ and an initial symmetrical positive definite matrix $H_0$, k:=0;

S1. making $$\nabla J(u_k)^T d_k + \frac{1}{2} d_k^T H_k d_k + \sum_{j\in I} \lambda_j \nabla G_j(u_k)^T d_k$$

minimum at $u_k$, $G_j(u_k)+\nabla G_j(u_k)^T d_k \le 0$, $j\in I$, and performing solution to obtain $d_k$;

S2. $u_{k+1}=u_k+u_k d_k$, a step $u_k$ being obtained by a line search;

S3. correcting $H_k$ to obtain $H_k+1$, such that $H_k+1$ is kept symmetrically positively definite; and S4. k:=k+1, returning to step S1.

In an example, the method is further provided with an optimal parameter optimal solution output module;

the optimal parameter optimal solution output module being used to output a final optimal parameter combination of the lens beam focus BF and defocus start DS of the OPC lithography model (Litho Model).

In an example, the optimal parameter optimal solution output module simultaneously outputs optimal parameter combinations of the lens beam focus BF and defocus start DS of the OPC lithography model (Litho Model) with the values of the objective function J(u) sorted in an ascending order.

In the method for optimizing OPC lithography model (Litho Model) parameters of the present application, in order to solve the problem of how to quickly and precisely find optimal matching parameters of parameters such as the lens beam focus BF and defocus start DS in modeling of the OPC lithography model (Litho Model), the preliminary suboptimal parameter combinations in proximity to the plurality of local minima of the lens beam focus BF and defocus start DS are quickly found by means of the random direction search method, and then the optimal parameter combination of the lens beam focus BF and defocus start DS is finally obtained on the basis of the suboptimal parameter combinations by means of the precise search method. In a system for optimizing OPC Litho Model parameters, an optimal parameter solution can be found quickly by combining the random direction search method and the precise search method, without artificially configuring an initial search point. Moreover, the algorithm has a high convergence rate and strong robustness, and can quickly and precisely obtain parameters such as the lens beam focus BF and defocus start DS in modeling of an OPC lithography model (Litho Model). The method is also applicable to three and more than three-dimensional OPC lithography model (Litho Model) parameter optimization.

BRIEF DESCRIPTION OF THE DRAWINGS

In order to more clearly explain the technical solutions of the present application, the drawings required in the present application will be briefly described below. It is obvious that the drawings described below are merely some embodiments of the present application, and those skilled in the art could also obtain other drawings on the basis of these drawings, without the exercise of inventive effort.

FIG. 1 is a schematic diagram of a method for optimizing OPC lithography model parameters of the present application.

DETAILED DESCRIPTION OF THE DISCLOSURE

The technical solution of the present application will be clearly and completely described below with reference to the drawings in the embodiments of the present application. Obviously, the described embodiments are merely part of the embodiments of the present application, rather than all of them. Based on the embodiments in the present application, all other embodiments obtained by those skilled in the art without the exercise of inventive effort shall fall into the protection scope of the present application.

The term "first" or "second" and other similar terms used in the present application do not indicate any order, quantity, or importance, but are only used to distinguish different constituent parts. The term "comprise" or "contain" and other similar terms indicate that a component or object in front of the term covers components or objects and equivalents thereof listed behind the term, without excluding other components or objects. The term "connect" or "couple" and other similar terms are not limited to physical or mechanical connections, but can include electrical connections, whether direct or indirect. The terms such as "upper", "lower", "left", and "right" are only used to represent a relative position relationship, and when the absolute position of a described object changes, the relative position relationship may also change accordingly.

It should be noted that the embodiments of the present application and the features in the embodiments can be combined with each other in the case of no conflict.

Embodiment 1

A method for optimizing OPC lithography model (Litho Model) parameters is provided with a parameter configuration module, a random direction method module, and a precise search method module.

The parameter configuration module is used to configure an objective function J(u) of a lithography model (Litho Model), as well as a parameter constraint condition and a convergence condition.

The random direction method module finds preliminary suboptimal parameter combinations in proximity to a plurality of local minima of a lens beam focus BF and defocus start DS of the OPC lithography model (Litho Model) by means of a random direction search method.

The precise search method module obtains, by means of a precise search method, an optimal parameter combination of the lens beam focus BF and defocus start DS of the OPC lithography model (Litho Model) on the basis of the suboptimal parameter combinations found by the random direction method module.

In the method for optimizing OPC lithography model (Litho Model) parameters of Embodiment 1, in order to solve the problem of how to quickly and precisely find optimal matching parameters of parameters such as the lens beam focus BF and defocus start DS in modeling of the OPC lithography model (Litho Model), the preliminary suboptimal parameter combinations in proximity to the plurality of local minima of the lens beam focus BF and defocus start DS are quickly found by means of the random direction search method, and then the optimal parameter combination of the lens beam focus BF and defocus start DS is finally obtained on the basis of the suboptimal parameter combinations by means of the precise search method. By the method for optimizing OPC Litho Model parameters, an optimal parameter solution can be found quickly by combining the random direction search method and the precise search method, without artificially configuring an initial search point. Moreover, the algorithm has a high convergence rate and strong robustness, and can quickly and precisely obtain parameters such as the lens beam focus BF and defocus start DS in modeling of an OPC lithography model (Litho Model). The method is also applicable to three and more than three-dimensional OPC lithography model (Litho Model) parameter optimization. Currently, the method for optimizing OPC lithography model (Litho Model) parameters is successfully applied to modeling of OPC lithography models of a plurality of products. Compared to a conventional parameter optimization method using meshing, the parameter optimization efficiency is improved by at least 50%, and the parameter optimization precision is further improved, having a very good application prospect.

Embodiment 2

Based on the method for optimizing OPC lithography model (Litho Model) parameters of Embodiment 1, the objective function J(u) of the lithography model is:

$$J(u) = \frac{1}{2n}\sqrt{\frac{\sum_{i=1}^{n} Wt_i * [T(x_i, y_i, BF, DS) - CD(x_i, y_i)]^2}{\sum_{I=1}^{n} Wt_i}},\ u = [BF, DS]^T.$$

$T(x_i, y_i, BF, DS)$ is a critical dimension (CD) value estimated by means of an optical imaging model, and $T(x_i, y_i, BF, DS)$ is related to light intensity and a specified threshold of the light intensity. The light intensity is related to projection objective system parameters of a lithography machine, parameters such as the lens beam focus BF and defocus start DS, and an exposure dose.

$CD(x_i, y_i)$ is a gauge calibration CD value obtained after exposure performed by an actual lithography system, $Wt_i$ is a weight coefficient, the value of which is in positive correlation with the importance of the CD value, and n is the number of all feature patterns.

The parameter constraint condition of the objective function J(u) of the OPC lithography model includes:

$$G_j(u) \le 0, j \in I;$$

$$G_1(u) = a_1 - BF, G_2(u) = BF - b_1; \text{ and}$$

$$G_3(u) = a_2 - DS, G_4(u) = DS - b_2.$$

$a_1$ is a BF lower limit value, $b_1$ is a BF upper limit value, $a_2$ is a DS lower limit value, and $b_2$ is a DS upper limit value, i.e., $a_1 \le BF \le b_1$, and $a_2 \le DS \le b_2$. $a_1$, $b_1$, $a_2$, and $b_2$ are determined by a lithography machine lens projection system and the thickness of a photoresist.

The convergence condition of the objective function J(u) of the OPC lithography model includes a random direction error $\varepsilon_1$ and a precise search method error $\varepsilon_2$, satisfying $0 \le \varepsilon_2 < \varepsilon_1 < 1$.

Embodiment 3

Based on the method for optimizing OPC lithography model (Litho Model) parameters of Embodiment 2, the random direction method module finds a feasible direction of a steepest descent in an objective function value on the basis of randomly generated feasible points and feasible directions of the lens beam focus BF and defocus start DS that satisfy the constraint condition, performs a line search to obtain a search step and thus obtain a next feasible point, then repeats the previous operation until a feasible point satisfying an error condition is finally found, and outputs the feasible point as a precise search initial feasible point to the precise search method module.

The precise search method module converts the objective function of the lithography model (Litho Model) into a sequential quadratic programming SQP objective function on the basis of the precise search initial feasible point, and solves the sequential quadratic programming SQP objective function according to the parameter constraint condition and the convergence condition, so as to obtain optimal lens beam focus BF parameter and defocus start DS parameter of the OPC lithography model (Litho Model).

Embodiment 4

Based on the method for optimizing OPC lithography model (Litho Model) parameters of Embodiment 3, an operation process of the random direction method module includes the following steps:

(1) configuring random direction method calculation precision $\varepsilon_1$;

(2) randomly selecting a feasible point as a random initial point $u_0$;

(3) generating k n-dimensional random unit vectors $e^j$ (j=1, 2, . . . , k), k being a positive integer;

(4) taking an experimental step $a_0$, and calculating k random points $u_j$;

(5) finding a feasible random points $u_L$ from the k random points, and generating a feasible search direction d, $d=u_L-u_0$;

(6) from the random initial point $u_0$, performing iteration using the feasible search direction d and the experimental $a_0$ until a new point u that satisfies all search conditions and has no descent in the objective function value is found; and (7) if the convergence condition satisfies $|J(u_L)-J(u_0)|<\varepsilon_1$, ending the iteration, or otherwise, assigning the value of $u_L$ to $u_0$, i.e., $u_0 \leftarrow u_L$, and returning to step (2).

In an example, a process of generating the random initial point $u_0$ is:

first generating two pseudo random numbers $q_1$ and $q_2$ within an interval (0, 1).

$$BF_0=a_1+q_1*(b_1-a_1), DS_0=a_2+q_2*(b_2-a_2), \text{ and } u_0=[BF_0, DS_0]^T.$$

In an example, a method of generating the k n-dimensional random unit vectors $e^j$ in step (3) is:

obtaining the random unit vector $e^j$ on the basis of a pseudo random number $r_i^j$ generated within an interval (−1,1), $$e^j = \frac{1}{\sqrt{\sum_{i=1}^{n}(r_i^j)^2}}\begin{bmatrix} r_1^j \\ r_2^j \\ \dots \\ r_n^j \end{bmatrix}.$$

Since the pseudo random number $r_i^j$ is generated within the interval (−1,1), the formed random direction vector $e^j$ is necessarily a unit vector uniformly distributed in a hypersphere space and having a modulus equal to 1.

In the method for optimizing OPC lithography model (Litho Model) parameters of Embodiment 4, an initial point that satisfies the constraint condition can be automatically generated without providing a feasible direction initial search point in advance. No derivative information of the objective function and a constraint function is required, resulting in a fast calculation speed. Each search is a search for a point in the feasible direction that can cause a descent in the objective function, so a point at the end of iteration of the algorithm is a global optimal point or local optimal point.

Embodiment 5

Based on the method for optimizing OPC lithography model (Litho Model) parameters of Embodiment 4, the precise search method module, on the basis of a current iteration feasible point $u_k$ using an SQP algorithm, obtains a feasible search direction $d_k$ and a corresponding Lagrange multiplier $\lambda_j$:

making $$\nabla J(u_k)^T d_k + \frac{1}{2} d_k^T H_k d_k + \sum_{j\in I} \lambda_j \nabla G_j(u_k)^T d_k$$

minimum.

$$G_j(u_K)+\nabla G_j(u_k)^T d_k \le 0, j\in I.$$

$H_k$ is a second derivative matrix $$\nabla_{uu}^2 L(u_k, \lambda_k)$$

of a Lagrange function $$L(u, \lambda) = J(u) + \sum_{j\in I} \lambda_j G_j(u)$$

with respect to u, a next iteration point is $u_{k+1}=u_k+d_k$, and $\lambda_j$ is a Lagrange constant.

In an example, the SQP algorithm used by the precise search method module includes the following steps:

S0. providing an initial point $u_0$ and an initial symmetrical positive definite matrix $H_0$, k:=0;

S1. making $$\nabla J(u_k)^T d_k + \frac{1}{2} d_k^T H_k d_k + \sum_{j\in I} \lambda_j \nabla G_j(u_k)^T d_k$$

minimum at $u_k$, $G_j(u_k)+\nabla G_j(u_k)^T d_k \le 0$, $j\in I$, and performing solution to obtain $d_k$;

S2. $u_{k+1}=u_k+u_k d_k$, a step $u_k$ being obtained by a line search;

S3. correcting $H_k$ to obtain $H_k+1$, such that $H_k+1$ is kept symmetrically positively definite; and S4. k:=k+1, returning to step S1.

In the method for optimizing OPC lithography model (Litho Model) parameters of Embodiment 5, the precise search method module adopts the precise search method. First, the feasible point of the BF and DS parameters transmitted from the random direction method module is used as the initial feasible point to convert the original optimization objective function and constraint condition into a sequential quadratic programming SQP problem, and the optimal BF and DS parameters of the lithography model (Litho Model) are obtained by solving the sequential quadratic programming. Since the initial feasible point is already a value close to the local optimal point which is obtained by the random direction method, the convergence rate reaches an ultralinear convergence rate. As the solution of a quadratic programming problem is very mature, the solution of the algorithm is much faster and more stable than an original nonlinear programming problem. Since an input point is a feasible point, it can be ensured that a final output is also a feasible point during the search.

Embodiment 6

Based on Embodiment 5, The method for optimizing OPC lithography model (Litho Model) parameters is further provided with an optimal parameter optimal solution output module.

The optimal parameter optimal solution output module is used to output a final optimal parameter combination of the lens beam focus BF and defocus start DS of the OPC lithography model (Litho Model).

In an example, the optimal parameter optimal solution output module simultaneously outputs optimal parameter combinations of the lens beam focus BF and defocus start DS of the OPC lithography model (Litho Model) with the values of the objective function J(u) sorted in an ascending order.

Embodiment 7

An example of the optimization of modeling parameters for an IOSDN OPC lithography model (Litho Model) is provided.

Based on the method for optimizing OPC lithography model (Litho Model) parameters of the present application, a Nikon ARF lithography machine is adopted, the thickness of a photoresist is 0.42 um, and wafer gauge data consists of 2963 points.

The optimization objective function J(u) is $$J(u)=\frac{1}{2n}\sqrt{\frac{\sum_{i=1}^{n}Wt_i*[T(x_i,y_i,BF,DS)-CD(x_i,y_i)]^2}{\sum_{I=1}^{n}Wt_i}},\ u=[BF,DS]^T.$$

Error configurations are: the random direction error $\varepsilon_1$=0.02, and the precise search method error $\varepsilon_2$=0.005.

Parameter ranges of the beam focus BF and defocus start DS are as follows:

−0.06 μm≤BF≤0.42 μm; and

−0.06 μm≤DS≤0.42 μm

The initial random point u=[BF, DS]$^T$ is set to 5000 combinations, and final results obtained after calibration are shown in Table 1. A total calibration time is 4.56 hours. It can be seen from Table 1 that the optimal u*(BF, DS)$^T$=(0.179,0.374)$^T$, and the objective function value J(u*) is 4.102. A total calibration time for the 5000 randomly generated initial points is 4.56 hours.

TABLE 1

Results of the optimization of the OPC lithography model (Litho Model) parameters in the present patent application

| Serial Number | Parameter combination category | BF | DS | Objective function value J |
|---|---|---|---|---|
| 1 | 1 | 0.179 | 0.374 | 4.102 |
| 2 | 1 | 0.180 | 0.373 | 4.104 |
| 3 | 1 | 0.180 | 0.375 | 4.107 |
| 4 | 1 | 0.179 | 0.373 | 4.111 |
| 5 | 1 | 0.181 | 0.372 | 4.118 |
| . . . | | | | |
| 28 | 2 | 0.024 | 0.277 | 4.155 |
| 29 | 2 | 0.025 | 0.277 | 4.158 |
| 30 | 2 | 0.025 | 0.278 | 4.162 |
| 31 | 2 | 0.023 | 0.276 | 4.171 |
| . . . | | | | |

In an existing parameter meshing optimization method, an error configuration is: ε=0.005.

Parameter ranges of the beam focus BF and defocus start DS are as follows:

−0.06 μm≤BF≤0.42 μm (meshing of 121 points, step=0.004); and

−0.06 μm≤DS≤0.42 μm (meshing of 121 points, step=0.004).

u=[BF, DS]$^T$ has totally 146410 combinations, and final results obtained after calibration are shown in Table 2. It can be seen from Table 2 that the optimal u*(BF, DS)$^T$=(0.180, 0.375)$^T$, and the objective function value J(u*)=4.107. A total calibration time for 146410 meshing points is 15.23 hours.

TABLE 2

Results of the optimization of the OPC lithography model (Litho Model) parameters in the existing parameter meshing optimization method

| Serial Number | Parameter combination category | BF | DS | Objective function value J |
|---|---|---|---|---|
| 1 | 1 | 0.180 | 0.375 | 4.107 |
| 2 | 1 | 0.184 | 0.373 | 4.111 |
| 3 | 1 | 0.180 | 0.373 | 4.114 |
| 4 | 1 | 0.180 | 0.373 | 4.134 |
| 5 | 1 | 0.180 | 0.377 | 4.137 |
| . . . | | | | |
| 16 | 2 | 0.025 | 0.278 | 4.160 |
| 17 | 2 | 0.025 | 0.276 | 4.163 |
| 18 | 2 | 0.023 | 0.278 | 4.168 |
| 19 | 2 | 0.025 | 0.280 | 4.172 |
| . . . | | | | |

Comparing Table 1 and Table 2, it can be found that calibration precision of the method for optimizing OPC lithography model (Litho Model) parameters provided in the present patent application is higher than that of the conventional meshing-based method, where J(u*)=4.102 and u*=(0.179,0.374) in the former method, and J(u*)=4.107 and u*=(0.180,0.375) in the latter method, both ultimately obtaining similar optimal for BF and DS parameters. Upon comparison, it can be found that the optimization time of the method provided in the present patent application is 10.67 hours shorter than that of the meshing method, that is, the optimization time is reduced by about 70%. If the number of parameters to be optimized is increased to 3 or more, it can be foreseen that the method of the present patent application can save more optimization time than the conventional meshing method (in which case the number of meshing points increases exponentially).

The above description is only some embodiments of the present application and is not intended to limit the present application. Any modifications, equivalent substitutions, improvements, etc. made within the spirit and principles of the present application shall be included within the scope of protection of the present application.

What is claimed is:

1. A system for optimizing OPC lithography model parameters, comprises a parameter configuration module, a random direction method module, and a precise search method module; wherein the parameter configuration module is used to configure an objective function J(u) of a lithography model, as well as a parameter constraint condition and a convergence condition;

the random direction method module finds preliminary suboptimal parameter combinations in proximity to a plurality of local minima of a lens beam focus BF and defocus start DS of the OPC lithography model by means of a random direction search method; and the precise search method module obtains, by means of a precise search method, an optimal parameter combination of the lens beam focus BF and defocus start DS of the OPC lithography model on the basis of the suboptimal parameter combinations found by the random direction method module, the objective function J(u) of the lithography model is:

$$J(u) = \frac{1}{2n}\sqrt{\frac{\sum_{i=1}^{n} wt_i * [T(x_i, y_i, BP, DS) - CD(x_i, y_i)]^2}{\sum_{i=1}^{n} wt_i}}, \; u = [BF, DS]^T;$$

$T(x_i, y_i, BF, DS)$ is a CD value estimated by means of an optical imaging model, $CD(x_i, y_i)$ is a gauge calibration CD value obtained after exposure performed by an actual lithography system, $Wt_i$ is a weight coefficient, the value of which is in positive correlation with the importance of the CD value, and n is the number of all feature patterns;

the parameter constraint condition of the objective function J(u) of the OPC lithography model comprises:

$$G_j(u) \le 0, j \in I;$$

$$G_1(u) = a_1 - BF, G_2(u) = BF - b_1; \text{ and}$$

$$G_3(u) = a_2 - DS, G_4(u) = DS - b_2;$$

$a_1$ is a BF lower limit value, $b_1$ is a BF upper limit value, $a_2$ is a DS lower limit value, and $b_2$ is a DS upper limit value, i.e., $a_1 \le BF \le b_1$, and $a_2 \le DS \le b_2$; $a_1$, $b_1$, $a_2$, and $b_2$ are determined by a lithography machine lens projection system and the thickness of a photoresist; and the convergence condition of the objective function J(u) of the OPC lithography model comprises a random direction error $\varepsilon_1$ and a precise search method error $\varepsilon_2$, satisfying $0 \le \varepsilon_2 < \varepsilon_1 < 1$.

2. The system for optimizing OPC lithography model parameters according to claim 1, wherein the random direction method module finds a feasible direction of a steepest descent in an objective function value on the basis of randomly generated feasible points and feasible directions of the lens beam focus BF and defocus start DS that satisfy the constraint condition, performs a line search to obtain a search step and thus obtain a next feasible point, then repeats the previous operation until a feasible point satisfying an error condition is finally found, and outputs the feasible point as a precise search initial feasible point to the precise search method module; and the precise search method module converts the objective function of the lithography model into a sequential quadratic programming SQP objective function on the basis of the precise search initial feasible point, and solves the sequential quadratic programming SQP objective function according to the parameter constraint condition and the convergence condition, so as to obtain optimal lens beam focus BF parameter and defocus start DS parameter of the OPC lithography model.

3. The system for optimizing OPC lithography model parameters according to claim 2, wherein an operation process of the random direction method module comprises the following steps:

(1) configuring random direction method calculation precision $\varepsilon_1$;

(2) randomly selecting a feasible point as a random initial point $u_0$;

(3) generating k n-dimensional random unit vectors $e^j$ (j=1, 2, . . . , k), k being a positive integer;

(4) taking an experimental step $a_0$, and calculating k random points $u_j$;

(5) finding a feasible random points $u_L$ from the k random points, and generating a feasible search direction d, $d=u_L-u_0$;

(6) from the random initial point $u_0$, performing iteration using the feasible search direction d and the experimental $a_0$ until a new point u that satisfies all search conditions and has no descent in the objective function value is found; and (7) if the convergence condition satisfies $|J(u_L)-J(u_0)|<\varepsilon_1$, ending the iteration, or otherwise, assigning the value of $u_L$ to $u_0$, i.e., $u_0 \leftarrow u_L$, and returning to step (2).

4. The system for optimizing OPC lithography model parameters according to claim 3, wherein a process of generating the random initial point $u_0$ is:

first generating two pseudo random numbers $q_1$ and $q_2$ within an interval (0, 1), $$BF_0 = a_1 + q_1 * (b_1 - a_1), DS_0 = a_2 + q_2 * (b_2 - a_2), \text{ and } u_0 = [BF_0, DS_0]^T.$$

5. The system for optimizing OPC lithography model parameters according to claim 3, wherein a method of generating the k n-dimensional random unit vectors $e^j$ in step (3) is:

obtaining the random unit vector $e^j$ on the basis of a pseudo random number $r_i^j$ generated within an interval (−1,1), $$e^j = \frac{1}{\sqrt{\sum_{i=1}^{n} (r_i^j)^2}} \begin{bmatrix} r_1^j \\ r_2^j \\ \cdots \\ r_n^j \end{bmatrix}.$$

6. The system for optimizing OPC lithography model parameters according to claim 3, wherein the precise search method module obtains, on the basis of a current iteration feasible point $u_k$ using an SQP algorithm, a feasible search direction $d_k$ and a corresponding Lagrange multiplier $\lambda_j$:

making:

$$\nabla J(u_k)^T d_k + \frac{1}{2} d_k^T H_k d_k + \sum_{j \in I} \lambda_j \nabla G_j(u_k)^T d_k$$

minimum, and $G_j(u_k)+\nabla G_j(u_k)^T d_k \le 0, j \in I;$ wherein $H_k$ is a second derivative matrix $$\nabla^2_{uu} L(u_k, \lambda_k)$$

of a Lagrange function $$L(u, \lambda) = J(u) + \sum_{j \in I} \lambda_j G_j(u)$$

with respect to u, a next iteration point is $u_{k+1}=u_k+d_k$, and $\lambda_j$ is a Lagrange constant.

7. The system for optimizing OPC lithography model parameters according to claim 6, wherein the SQP algorithm used by the precise search method module comprises the following steps:

S0. providing an initial point $u_0$ and an initial symmetrical positive definite matrix $H_0$, k:=0;

S1. making $$\nabla J(u_k)^T d_k + \frac{1}{2} dk^T H_k d_k + \sum_{j \in I} \lambda_j \nabla G_j(u_k)^T d_k$$

minimum at $u_k$, $G_j(u_k)+\nabla G_j(u_k)^T d_k \le 0$, $j \in I$, and performing solution to obtain $d_k$;

S2. $u_{k+1}=u_k+\mu_k d_k$, a step $\mu_k$ being obtained by a line search;

S3. correcting $H_k$ to obtain $H_{k+1}$, such that $H_{k+1}$ is kept symmetrically positively definite; and S4. k:=k+1, returning to step S1.

8. The system for optimizing OPC lithography model parameters according to claim 1, further provided with:

an optimal parameter optimal solution output module;

the optimal parameter optimal solution output module being used to output a final optimal parameter combination of the lens beam focus BF and defocus start DS of the OPC lithography model.

9. The system for optimizing OPC lithography model parameters according to claim 8, wherein the optimal parameter optimal solution output module simultaneously outputs optimal parameter combinations of the lens beam focus BF and defocus start DS of the OPC lithography model with the values of the objective function J(u) sorted in an ascending order.

* * * * *